United States Patent
Shih et al.

(10) Patent No.: US 9,529,249 B2
(45) Date of Patent: Dec. 27, 2016

(54) EXTREME ULTRAVIOLET LITHOGRAPHY PROCESS AND MASK

(71) Applicant: Taiwan Semiconductor Manufacturing Company, Ltd., Hsin-Chu (TW)

(72) Inventors: Chih-Tsung Shih, Hsinchu (TW); Shinn-Sheng Yu, Hsinchu (TW); Jeng-Horng Chen, Hsin-Chu (TW); Anthony Yen, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 189 days.

(21) Appl. No.: 14/331,974

(22) Filed: Jul. 15, 2014

(65) Prior Publication Data

US 2015/0138524 A1    May 21, 2015

Related U.S. Application Data

(60) Provisional application No. 61/904,918, filed on Nov. 15, 2013.

(51) Int. Cl.
| | | |
|---|---|---|
| *G03F 1/26* | (2012.01) | |
| *G03F 1/24* | (2012.01) | |
| *G03F 1/48* | (2012.01) | |
| *G03F 1/28* | (2012.01) | |
| *G03F 7/20* | (2006.01) | |

(52) U.S. Cl.
CPC . *G03F 1/24* (2013.01); *G03F 1/28* (2013.01); *G03F 1/48* (2013.01); *G03F 7/70283* (2013.01)

(58) Field of Classification Search
CPC .......... G03F 1/26; G03F 1/24; G03F 7/70158
USPC .............................................................. 43/5
See application file for complete search history.

(56) References Cited

U.S. PATENT DOCUMENTS

2013/0260288 A1* 10/2013 Yu .............................. G03F 1/24
430/5

FOREIGN PATENT DOCUMENTS

| JP | 2007033753 | | 2/2007 |
| JP | 2007033753 | A | 2/2007 |
| JP | 2013074269 | A | 4/2013 |
| KR | 20030006968 | A | 1/2003 |
| KR | 1020050007150 | A | 1/2005 |

OTHER PUBLICATIONS

Notice of Allowance issued in Taiwan Patent Application No. 10-2014-0159058 on Aug. 23, 2016.
Notice of Allowance of Patent and translation received in Korean Patent Application No. 10-2014-0159058 dated Aug. 23, 2016.

* cited by examiner

*Primary Examiner* — Stephen Rosasco
(74) *Attorney, Agent, or Firm* — Haynes and Boone, LLP

(57) ABSTRACT

A system of an extreme ultraviolet lithography (EUVL) is disclosed. The system includes a mask having reflective phase-shift-grating-blocks (PhSGBs). The system also includes an illumination to expose the mask to produce a resultant reflected light from the mask. The resultant reflected light contains mainly diffracted lights. The system also has projection optics to collect and direct resultant reflected light to expose a target.

20 Claims, 7 Drawing Sheets

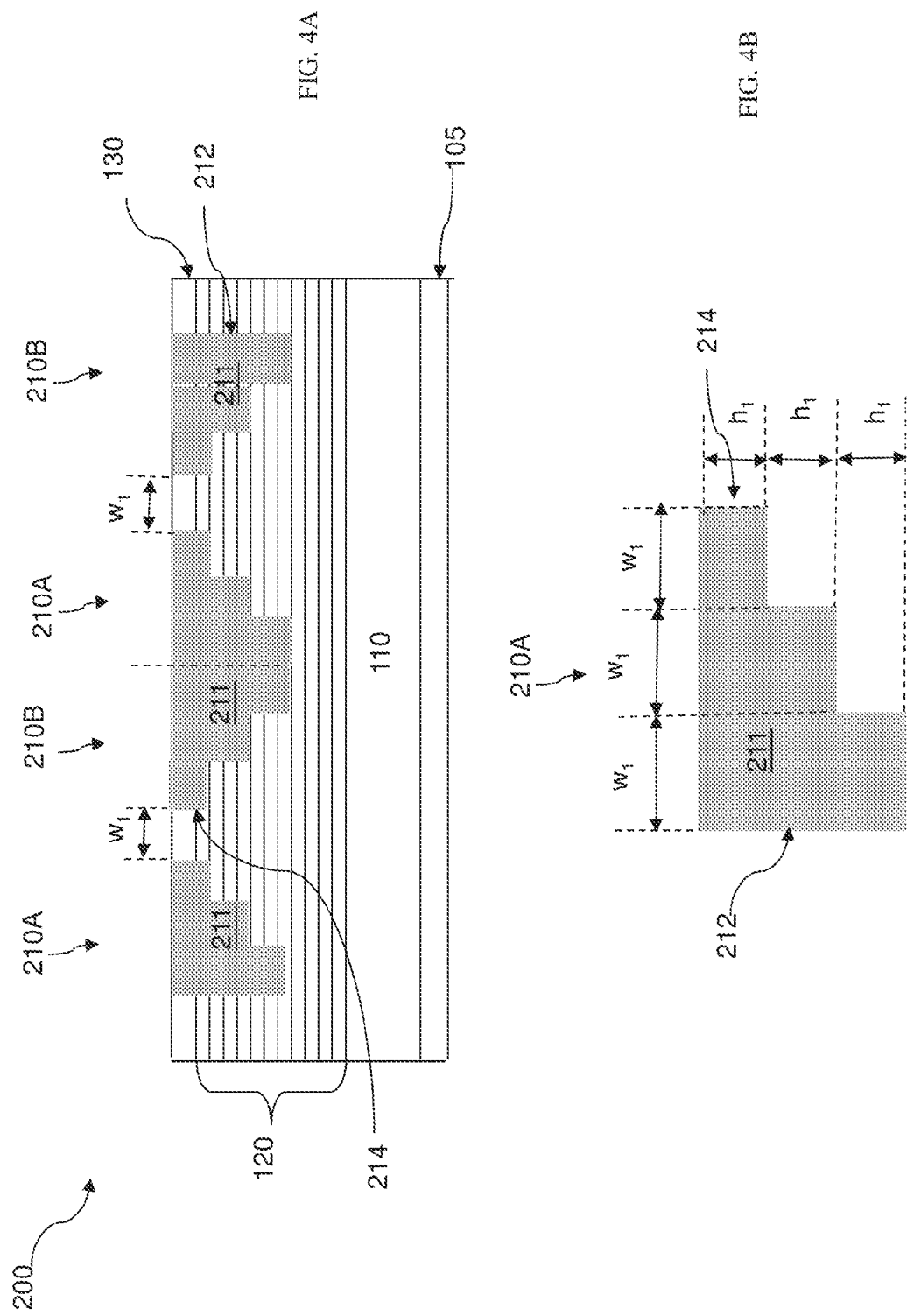

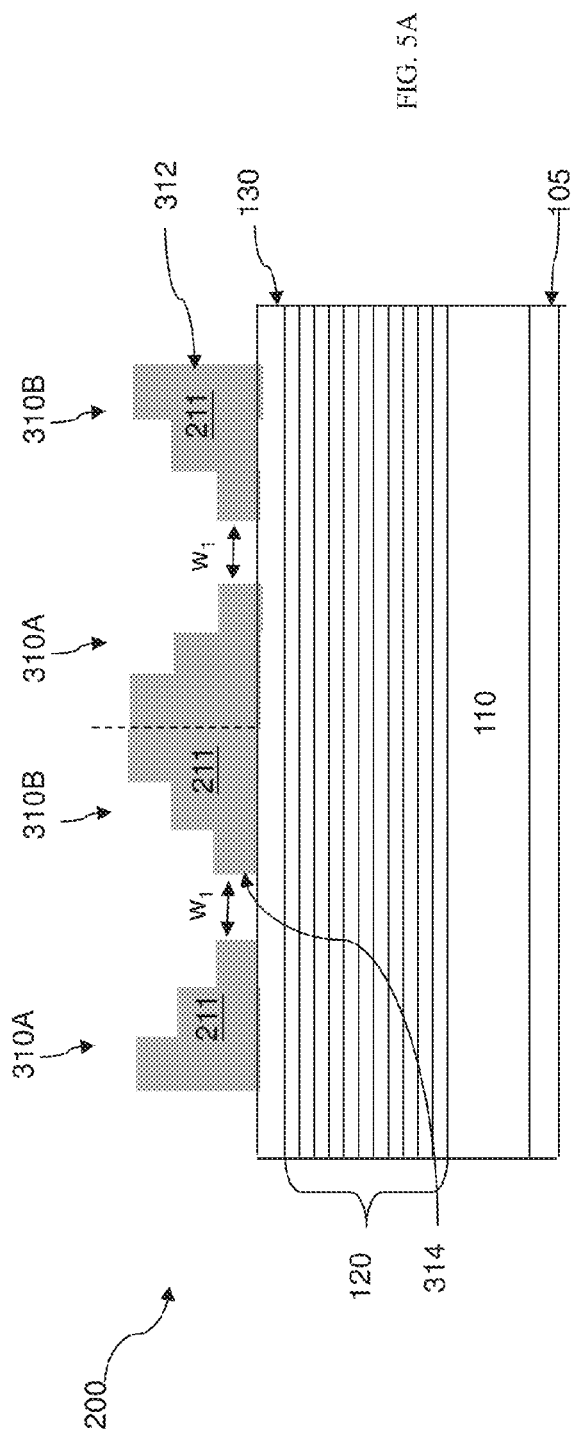
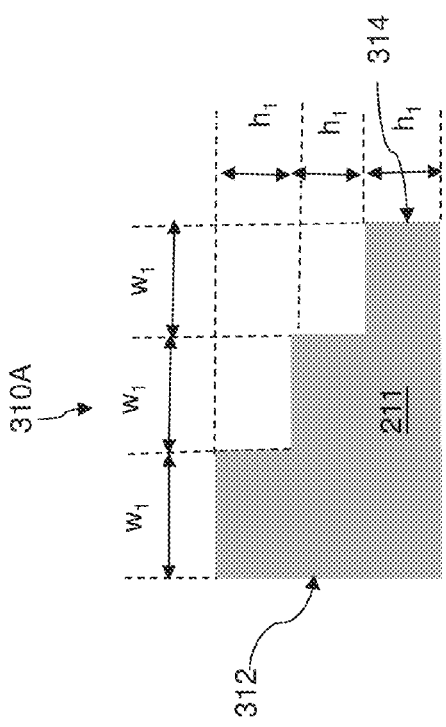
FIG. 5A
FIG. 5B

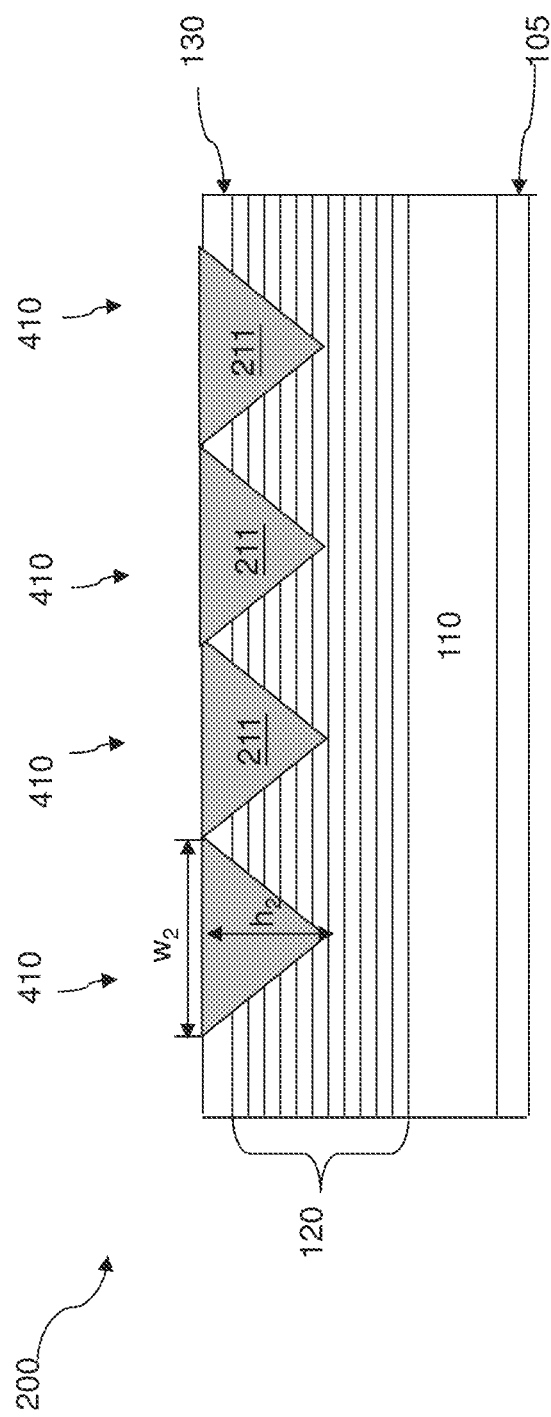

EXTREME ULTRAVIOLET LITHOGRAPHY PROCESS AND MASK

This patent claims the benefit of U.S. Ser. No. 61/904,918 filed Nov. 15, 2013, which is hereby incorporated by reference.

BACKGROUND

The semiconductor integrated circuit (IC) industry has experienced rapid growth in the past several decades. Technological advances in semiconductor materials and design have produced increasingly smaller and more complex circuits. These material and design advances have been made possible as the technologies related to processing and manufacturing have also undergone technical advances. As a size of the smallest component has decreased, numerous challenges have risen. For example, the need to perform higher resolution lithography processes grows. One lithography technique is extreme ultraviolet (EUV) lithography. Other techniques include X-Ray lithography, ion beam projection lithography, electron beam projection lithography, and multiple electron beam maskless lithography.

EUV lithography is a promising patterning technology for very small semiconductor technology nodes, such as 14-nm and beyond. EUV lithography is very similar to optical lithography in that it needs a mask to print wafers, except that it employs light in the EUV region, e.g., at about 13.5 nm. At the wavelength of 13.5 nm, most materials are highly absorbing. Thus, reflective optics, rather than refractive optics, are commonly used in EUV lithography. Although existing methods of EUV lithography have been generally adequate for their intended purposes, they have not been entirely satisfactory in all respects. For example, challenges rise to obtain high optical contrast. It is desired to have improvements in this area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 4A-4B are diagrammatic cross-sectional views of various aspects of one embodiment of an EUV mask at various stages of a lithography process constructed according to aspects of the present disclosure.

FIGS. 5A-5B are diagrammatic cross-sectional views of various aspects of another embodiment of an EUV mask at various stages of a lithography process constructed according to aspects of the present disclosure.

FIGS. 6A-6B are diagrammatic cross-sectional views of various aspects of yet another embodiment of an EUV mask at various stages of a lithography process constructed according to aspects of the present disclosure.

DETAILED DESCRIPTION

Figure 1:
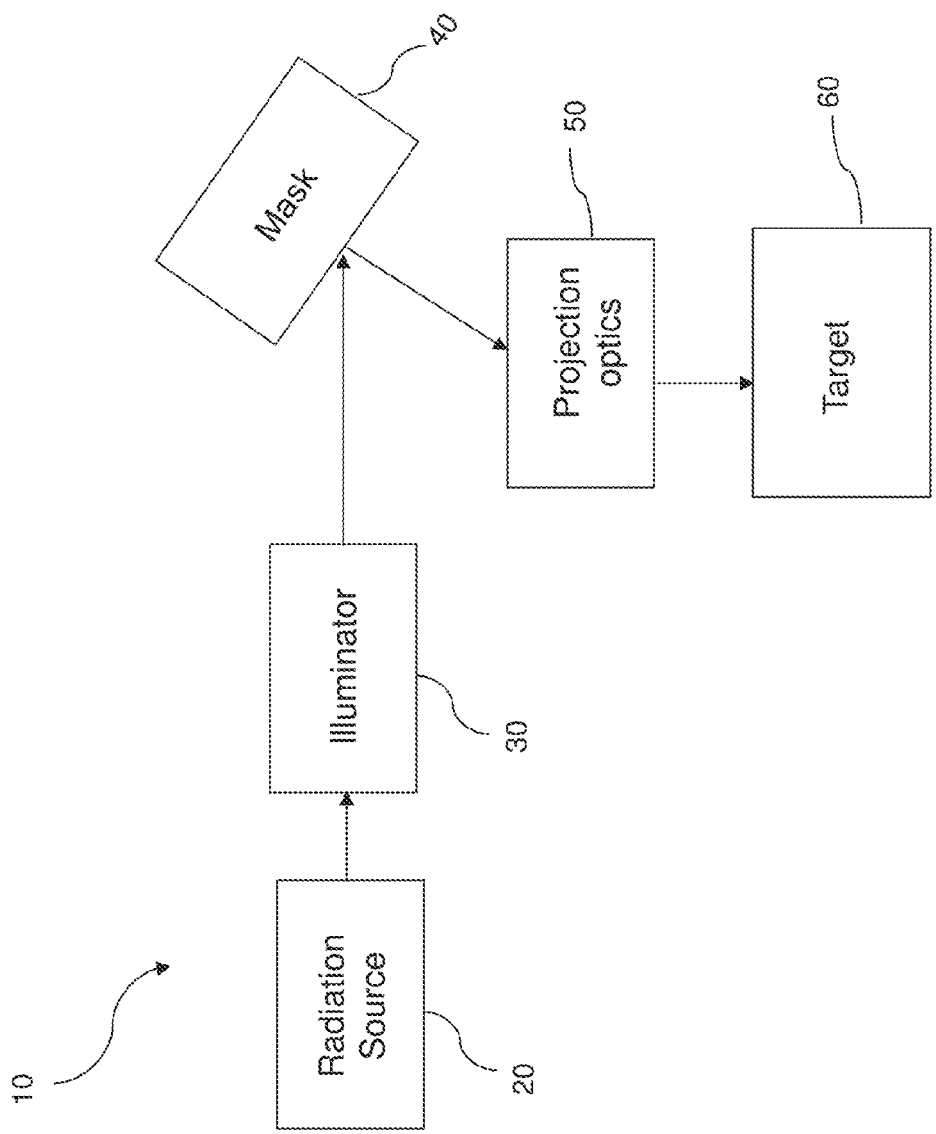
FIG. 1 is a block diagram of a lithography system for implementing one or more embodiments of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

Referring to FIG. 1, an EUV lithography system 10 that may benefit from one or more embodiments of the present invention is disclosed. The EUV lithography system 10 employs an EUV radiation source 20 having a wavelength of about 1-100 nm, including an EUV wavelength of about 13.5 nm.

The EUV lithography system 10 also employs an illuminator 30. The illuminator 30 may comprise refractive optics, such as a single lens or a lens system having multiple lenses (zone plates) and/or reflective optics, such as a single mirror or a mirror system having multiple mirrors in order to direct light from the radiation source 20 onto a mask 40. In the EUV wavelength range, reflective optics is employed generally. Refractive optics, however, can also be realized by zoneplates. In the present embodiment, the illuminator 30 is set up to provide an on-axis illumination to illuminate a mask 40. In on-axis illumination, all incoming light rays incident on the mask are at the same angle of incidence (AOI), e.g., AOI=6°, as that of a chief ray. In many situations, there may be some angular spread of the incident light. For example, the EUV lithography system 10 may utilize disk illumination (i.e., illumination on a pupil plane is shaped like a disk centered at the pupil center). Partial coherence σ can also be used to describe a point source which produces a plane wave for illuminating the mask 40.

In the present embodiment, it is sufficient to employ a nearly on-axis illumination having point sources with σ less than 0.3.

The EUV lithography system 10 also employs a mask 40 (the terms mask, photomask, and reticle are used herein to refer to the same item). In the present embodiment, the mask 40 is a reflective mask. The mask 40 may incorporate other resolution enhancement techniques such as optical proximity correction (OPC). The mask 40 will be described in further detail later.

Figure 2A:
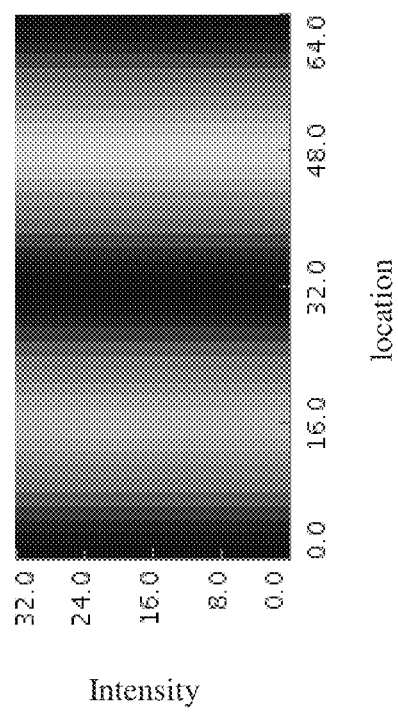
FIGS. 2A and 2B are diagrammatical views of various exposing intensity profiles during a lithography exposure process according to one or more embodiments of the present disclosure.
Figure 2B:
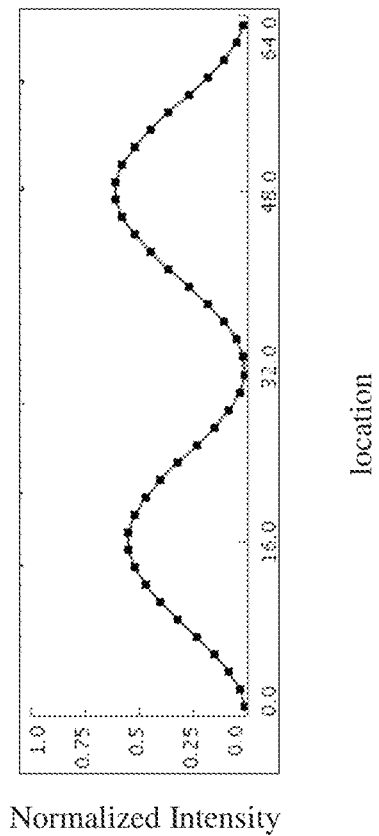

In general, an incident light ray reflected from a mask diffracts into various diffraction orders due to presence of these mask patterns, such as a 0-th diffraction order ray, a −1-st diffraction order ray and a +1-st diffraction order ray. In the present embodiment, the 0-th diffracted light rays are mostly eliminated due a structure of the mask 40, which will be described in details later. The −1-st and +1-st diffraction order are collected and directed to expose a target. Since the strength of the −1-st and +1-st diffraction order rays are well balanced, they interfere with each other and will generate a high contrast aerial image. As an example, equipped with the mask 40, a high contrast and uniform light intensity across a substrate is achieved, as shown in FIGS. 2A and 2B. FIGS. 2A and 2B graphically illustrate the exposure intensity distribution (vertical scale) across a photoresist layer on a substrate to be exposed (horizontal scale). In FIG. 2B, the unit for the exposing intensity is a relative unit ranging from 0 to 1. In this case, "1" stands for 100% of the exposing intensity from the exposing system before reaching the photoresist layers.

The EUV lithography system 10 also employs projection optics 50. The projection optics 50 may have refractive optics or reflective optics. The radiation reflected from the mask 40 (e.g., a patterned radiation) is collected by the projection optics 50. An incident light ray, after being reflected from the mask 40, is diffracted into various diffraction orders due to presence of these mask patterns, such as a −1-st diffraction order ray and a +1-st diffraction order ray.

The target 60 includes a semiconductor wafer with a photosensitive layer (e.g., photoresist or resist), which is sensitive to the EUV radiation. The target 60 may be held by a target substrate stage. The target substrate stage provides control of the target substrate position such that the image of the mask is scanned onto the target substrate in a repetitive fashion (though other lithography methods are possible).

The following description refers to the mask 40 and a mask fabrication process. The mask fabrication process usually includes two steps: a mask substrate fabrication process and a mask patterning process. During the mask substrate fabrication process, a mask substrate is formed by deposing suitable layers (e.g., multiple reflective layers) on a suitable material layer. The mask substrate is patterned during the mask patterning process to have a design of a layer of an integrated circuit (IC) device (or chip). The patterned mask is then used to transfer circuit patterns (e.g., the design of a layer of an IC device) onto a semiconductor wafer. The patterns can be transferred over and over onto multiple wafers through various lithography processes. Several masks (for example, a set of 15 to 30 masks) may be used to construct a complete IC device.

Figure 3:
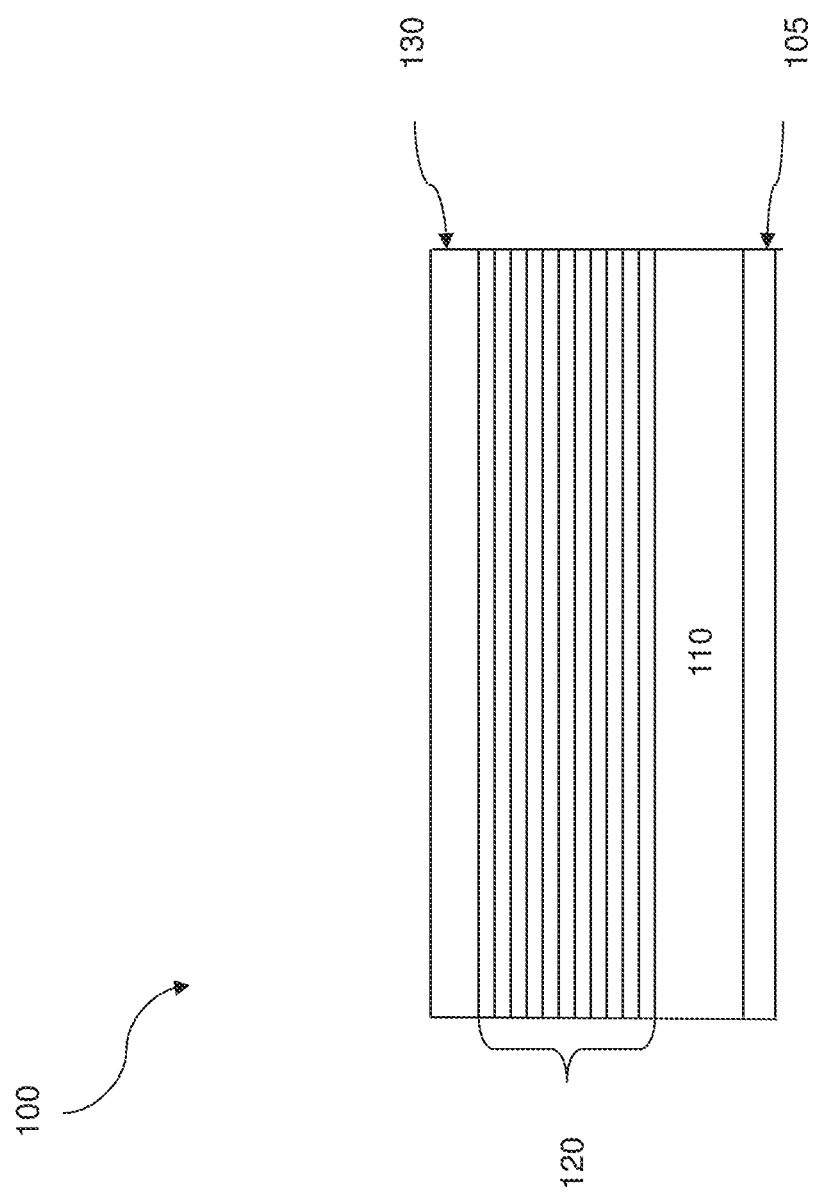
FIG. 3 is a diagrammatic cross-sectional view of various aspects of one embodiment of a mask substrate at various stages of a lithography process constructed according to aspects of the present disclosure.

Referring to FIG. 3, an EUV mask substrate 100 comprises a material layer 110 made of low thermal expansion material (LTEM). The LTEM includes $TiO_2$ doped $SiO_2$, and/or other low thermal expansion materials known in the art. The LTEM layer 110 serves to minimize image distortion due to mask heating. In the present embodiment, the LTEM layer includes materials with a low defect level and a smooth surface. In addition, a conductive layer 105 may be deposed under (as shown in the figure) the LTEM layer 110 for the electrostatic chucking purpose. In an embodiment, the conductive layer 105 includes chromium nitride (CrN), though other compositions are possible.

The EUV mask substrate 100 includes a reflective multilayer (ML) 120 deposed over the LTEM layer 110. According to Fresnel equations, light reflection will occur when light propagates across the interface between two materials of different refractive indices. The reflected light is larger when the difference of refractive indices is larger. To increase the reflected light, one may also increase the number of interfaces by deposing a multilayer of alternating materials and let light reflected from different interfaces interfere constructively by choosing appropriate thickness for each layer inside the multilayer. However, the absorption of the employed materials for the multilayer limits the highest reflectivity that can be achieved. The reflective ML 120 includes a plurality of film pairs, such as molybdenum-silicon (Mo/Si) film pairs (e.g., a layer of molybdenum above or below a layer of silicon in each film pair). Alternatively, the reflective ML 120 may include molybdenum-beryllium (Mo/Be) film pairs, or any material that is highly reflective at EUV wavelengths can be utilized for the reflective ML 120. The thickness of each layer of the reflective ML 120 depends on the EUV wavelength and the incident angle. The thickness of the reflective ML 120 is adjusted to achieve a maximum constructive interference of the EUV light reflected at each interface and a minimum absorption of the EUV light by the reflective ML 120. The reflective ML 120 may be selected such that it provides a high reflectivity to a selected radiation type/wavelength. A typical number of film pairs is 20-80, however any number of film pairs is possible. The reflective ML 120 usually achieves a reflectance of 0.65 or above. In an embodiment, the reflective ML 120 includes forty pairs of layers of Mo/Si. Each Mo/Si film pair has a thickness of about 7 nm, with a total thickness of 280 nm. In this case, a reflectivity of about 70% is achieved.

The EUV mask substrate 100 may also include a capping layer 130 disposed above the reflective ML 120 to prevent oxidation of the reflective ML. In one embodiment, the capping layer 130 includes ruthenium (Ru), Ru compounds such as RuB, RuSi, chromium (Cr), Cr oxide, and Cr nitride.

One or more of the layers 105, 120 and 130 may be formed by various methods, including physical vapor deposition (PVD) process such as evaporation and DC magnetron sputtering, a plating process such as electrode-less plating or electroplating, a chemical vapor deposition (CVD) process such as atmospheric pressure CVD (APCVD), low pressure CVD (LPCVD), plasma enhanced CVD (PECVD), or high density plasma CVD (HDP CVD), ion beam deposition, spin-on coating, metal-organic decomposition (MOD), and/or other methods known in the art.

Referring to FIGS. 4A-4B, for the sake of example, an EUV mask 200 is formed using the EUV mask substrate 100. The EUV mask 200 includes a plurality of blocks, referred to generally as a first reflective phase-shift-grating block (PhSGB) 210. The first reflective PhSGB 210 is formed by a reflective PhSGB layer 211 including Mo, aluminum (Al), actinium (Ac), or other suitable material. The reflective PhSGB layer 211 may include multiple layers. In one embodiment, the first reflective PhSGB 210 is formed in the ML 120. The first reflective PhSGB 210 has a first vertical side 212, a second vertical side 214, a bottom side with a three-step bottom profile and a flat top side aligning with a top surface of the capping layer. The first vertical side 212 has the longest length and the second vertical side 214 has the shortest length. The three steps have a common step width, a first width $w_1$ and common step height, a first height $h_1$. The first width $w_1$ is one fourth of a pitch width of a circuit pattern. The first height $h_1$ is chosen to introduce a 90 degree phase shift of light reflected between two adjacent steps.

For the sake of further example, a reflective PhSGB 210A represents a first orientation of the first reflective PhSGB 210, which has a short vertical side 214 located on the right side of the long vertical side 212, as shown in FIG. 4A. A reflective PhSGB 210B represents a second orientation, which has the short vertical side 214 located on the left side of the long vertical side 212, as shown in FIG. 4A. In the present embodiment, a plurality of first reflective PhSGB 210 are arranged in such a way that either the long vertical side 212 of the PhSGB 210A is located adjacent to and side-by-side with the long vertical side 212 of the reflective PhSGB 210B; likewise the short vertical side 214 of the reflective PhSGB 210A is separated by the width $w_1$ from the short vertical side 214 of the reflective PhSGB 210B. This alternating arrangement of blocks is repeated across the EUV mask 200.

The first reflective PhSGB 210 may be formed by any suitable processes. For example, lithography patterning and etching the ML 120 is performed to form a trench having a three-step bottom profile in the ML 120 first. The patterning and etching process may be performed multiple times to form the trench with the three-step bottom profile. Then the PhSGB layer 211 is deposited to fill in the trench to form the first reflective PhSGB 210.

Referring FIGS. 5A-5B, in another embodiment, instead of being formed in the ML 120, a second reflective PhSGB 310 is formed above the capping layer 130. The second reflective PhSGB 310 is formed by the PhSGB layer 211. The second reflective PhSGB 310 has a third vertical side 312, a fourth vertical side 314, a top side with a three-step top profile and a flat bottom side aligning with a top surface of the capping layer. The third vertical side 312 has the longest length and the fourth vertical side 314 has the shortest length. The three steps have a same width, the first width $w_1$ and same height, the first height $h_1$.

For the sake of further reference, reflective PhSGB 310A represents a third orientation of the second reflective PhSGB 310, which has the short vertical side 314 located on right side of the long vertical side 312, and reflective PhSGB 310B represents a fourth orientation, which has the short vertical side 314 located on the left side of the long vertical side 312. In the present embodiment, a plurality of second reflective PhSGB 310s are arranged in a such way that either the long vertical side 312 of the reflective PhSGB 310A locates side by side to the long vertical side 312 of the reflective PhSGB 310B or the short vertical side 314 of the reflective PhSGB 310A is separated by the first width $w_1$ to the short vertical side 314 of the reflective PhSGB 310B.

The second reflective PhSGB 310 may be formed by any suitable processes. For example, the reflective PhSGB layer 211 is deposited over the capping layer 130 first. Then lithography patterning and etching are performed to form the second reflective PhSGB 310 having the three-step top profile. The patterning and etching process may be performed multiple times to the three-step top profile.

Referring FIGS. 6A-6B, in yet another embodiment, a third reflective PhSGB 410 is formed in the ML 120. The third reflective PhSGB 410 includes the reflective PhSGB layer 211. The third reflective PhSGB 410 has v-shape bottom profile and a flat top profile aligning with the top surface of the capping layer 130. A second width $w_2$ of the third reflective PhSGB PhSB 410 is two times the pitch size of the circuit pattern. A second height $h_2$ of the reflective PhSGB 410 is chosen to introduce a 360 degree phase shift of light reflected between top and bottom. The third reflective PhSGB 410 may be formed by any suitable processes. For example, a lithography patterning and etching the ML 120 is performed to form a v-shape trench in the ML 120 first. Then the reflective PhSGB layer 211 is deposited to fill in the trench to form the third reflective PhSGB 410. For another example, a photoresist layer is coated over the capping layer 130 and an e-beam patterning process is performed with a various exposure energy to form a v-shape pattern on the photoresist layer. Followed by an etching process to etch the capping layer 130 and the ML 120 through the v-shape resist pattern to form the v-shape trench in the ML 120. The reflective PhSGB layer 211 is filled in the v-shape trench to form the reflective PhSGB 410. In the present embodiment, a plurality of third reflective PhSGB 410s are arranged to locates side by side.

Figure 7:
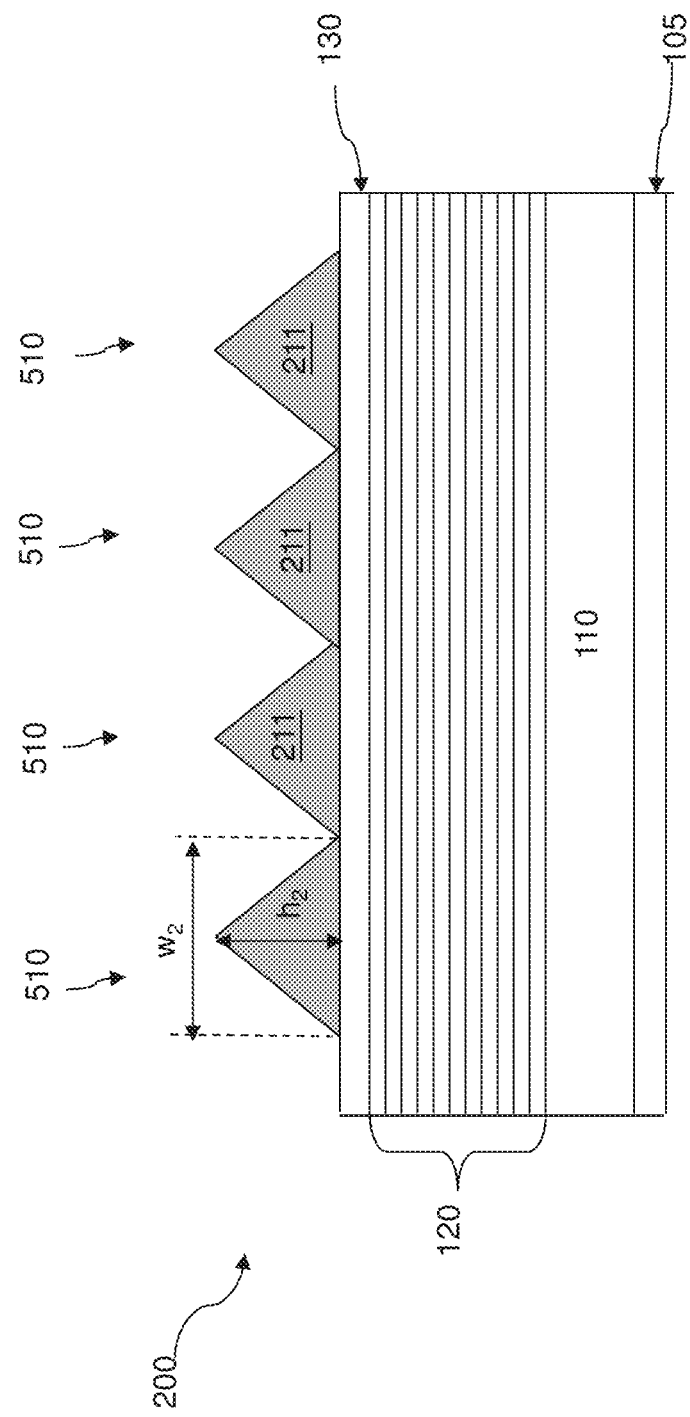
FIG. 7 is a diagrammatic cross-sectional view of various aspects of yet another embodiment of an EUV mask at various stages of a lithography process constructed according to aspects of the present disclosure.

Referring FIG. 7, in yet another embodiment, instead of being formed in the ML 120, a fourth reflective PhSGB 510 is formed above the capping layer 130. The fourth reflective PhSGB 510 is formed by the reflective PhSGB layer 211. The fourth reflective PhSGB 510 has Λ-shape top side and a flat bottom side aligning with the top surface of the capping layer 130. The fourth reflective PhSGB 510 has the second width $w_2$ and the second height $h_2$.

The fourth reflective PhSGB 510 may be formed by any suitable processes. For example, the reflective PhSGB layer 211 is deposited over the capping layer first. Then a photoresist layer is coated over the reflective PhSGB 211 and an e-beam patterning process is performed with a various exposure energy to form a Λ-shape pattern on the photoresist layer. Next, an etching process is used to etch the reflective PhSGB 211 through the Λ-shape resist pattern to form the reflective PhSGB 510 with Λ-shape top profile. In the present embodiment, a plurality of third reflective PhSGB 410s are arranged to locates side by side.

Based on the above, the present disclosure offers the EUV lithography system and process employing an EUV mask having a structure of reflective phase-shift-grating-blocks (PhSGBs). The PhSGB is configured such that reflected light reflected from one end of the PhSGB has an about 180-degree phase shift and a substantially equal intensity with respect to a reflected light reflected from another end of the PhSGB. Thus, a resultant reflected light constructed by reflective lights from the PhSGB contains almost zero 0-th diffraction order and the resultant reflected light contains mainly −1-st and +1-st diffraction. The EUV lithography system and process demonstrates an enhancement of aerial image contrast and improvement of process window and throughput.

The present disclosure is directed towards lithography systems. In one embodiment, an extreme ultraviolet lithography (EUVL) system includes a mask having a plurality of reflective phase-shift-grating-blocks (PhSGBs), an illumination system to expose the mask to produce a resultant reflected light reflected from the mask, including from the reflective PhSGB. The resultant reflected light includes mainly diffracted lights. The system also includes an optics system to collect and direct the resultant reflected light towards a target.

The present disclosure is also directed towards masks. In one embodiment, the mask for extreme ultraviolet lithography (EUVL) includes a low thermal expansion material (LTEM) layer, a reflective multilayer (ML) above one surface of the LTEM layer, a conductive layer above an opposite surface of the LTEM layer, a capping layer deposited over the ML and a plurality of reflective phase-shift-grating-blocks (PhSGBs) formed in the ML. The reflective PhSGB includes one of two shapes. a three-step shape, which includes a long vertical side, a short vertical side, a bottom side with a three-step bottom profile and a flat top side which aligning with a top surface of the ML. Each of the three steps have a same first width $w_1$, which is about one fourth of a pitch width of a pattern and a same first height $h_1$, which introduces an about 90 degree phase shift of light reflected between two adjacent steps; and a v-shape shape which includes a v-shape bottom profile and a flat top profile which aligning with the top surface of the ML. The v-shape reflective PhSGB has a second width $w_2$, which is about two times of the pitch width of the pattern and a second height $h_2$, which introduces a 360 degree phase shift of light reflected between bottom and top of the reflective PhSGB.

In one embodiment, the mask for extreme ultraviolet lithography (EUVL) includes a low thermal expansion material (LTEM) layer, a reflective multilayer (ML) above one surface of the LTEM layer, a conductive layer above an opposite surface of the LTEM layer, a capping layer deposited over the ML and a plurality of reflective phase-shift-grating-blocks (PhSGBs) formed above the capping layer. The reflective PhSGBs includes one of two shapes: a three-step shape which includes a long vertical side, a short vertical side, a top side with a three-step bottom profile and a flat bottom side which aligning with a top surface of the capping layer. Each of the three steps have a same first width $w_1$, which is about one fourth of a pitch width of a pattern, wherein each of the three steps has a same first height $h_1$, which introduces an about 90 degree phase shift of light reflected between two adjacent steps; and a Λ-shape which includes a Λ-shape top profile and a flat bottom profile aligning with the top surface of the capping layer. The Λ-shape reflective PhSGB has a second width $w_2$, which is about two times of the pitch width of the pattern and a second height $h_2$, which introduces a 360 degree phase shift of light reflected between bottom and top of the reflective PhSGB.

The foregoing outlined features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An extreme ultraviolet (EUV) lithography system, comprising:
   a mask having a plurality of reflective phase-shift-grating-blocks (PhSGBs);
   an illumination source to expose the mask to produce a resultant reflected light reflected from the mask, the resultant reflected light including reflected light from the reflective PhSGBs, wherein the resultant reflected light includes mainly diffracted lights; and
   optics to collect and direct the resultant reflected light towards a target.

2. The system of claim 1, wherein the reflective PhSGBs include materials from the group consisting of molybdenum (Mo), aluminum (Al) and actinium (Ac).

3. The system of claim 1, wherein the mask having the reflective PhSGBs comprises:
   a low thermal expansion material (LTEM) layer;
   a conductive layer disposed over an opposite surface of the LTEM layer;
   a reflective multilayer (ML) disposed over one surface of the LTEM layer;
   the reflective PhSBGs formed in the reflective ML; and
   a capping layer deposited over the reflective ML.

4. The system of claim 3, wherein each reflective PhSGB has a shape including a long vertical side, a short vertical side, a three-step bottom profile and a flat top profile.

5. The system of claim 4, wherein each step of the three-step bottom profile has a common first width $w_1$, which is about one fourth of a pitch width of a pattern.

6. The system of claim 5, wherein each step of the three-step bottom profile has a common first height $h_1$, which introduces an about 90 degree phase shift of light reflected between two adjacent steps.

7. The system of claim 4, wherein a plurality of reflective PhSGBs is arranged such that:
   the long vertical side of a first reflective PhSGB is positioned back to back with the long vertical side of a second reflective PhSGB;
   the short vertical the first reflective PhSGB is separated by a first width w1 to the short vertical side of a third reflective PhSGB.

8. The system of claim 3, wherein the reflective PhSGBs have a shape with a v-shape bottom profile and a flat top profile.

9. The system of claim 8, wherein each of the v-shape bottom profiles has a second width $w_2$, which is about two times of a pitch width $w_1$ of the pattern, and a second height $h_2$, which introduces a 360 degree phase shift of light reflected between bottom and top of the corresponding reflective PhSGB.

10. The system of claim 1, wherein the mask having the reflective PhSGBs comprises:
    a low thermal expansion material (LTEM) layer;
    a conductive layer disposed over an opposite surface of the LTEM layer;
    a reflective multilayer (ML) disposed over one surface of the LTEM layer;
    a capping layer deposited over the reflective ML; and
    the reflective PhSBGs formed above the capping layer.

11. The system of claim 10, wherein each of the reflective PhSGBs has a shape including a long vertical side, a short vertical side, a top side with a three-step top profile and a flat bottom side aligning with a top surface of the capping layer.

12. The system of claim 11, wherein each of the three steps have a common first width $w_1$ and a common first step height $h_1$.

13. The system of claim 12, wherein a plurality of reflective PhSGBs is arranged such that:
    the long vertical side of a first reflective PhSGB is located back-to-back with the long vertical side of a second reflective PhSGB;
    the short vertical side of the first reflective PhSGB is separated by the first width $w_1$ to the short vertical side of a third reflective PhSGB.

14. The system of claim 11, wherein each of the reflective PhSGBs has a shape with an angular-shape top profile and a flat bottom profile aligning with the top surface of the capping layer.

15. The system of claim 14, wherein each of the reflective PhSGBs has a common width $w_2$ and a common height $h_2$.

16. The system of claim 1, wherein the resultant reflected light contains almost zero non-diffracted light.

17. A lithography mask comprising:
   a low thermal expansion material (LTEM) layer;
   a reflective multilayer (ML) above one surface of the LTEM layer;
   a conductive layer above an opposite surface of the LTEM layer;
   a capping layer deposited over the ML; and
   a plurality of reflective phase-shift-gating-blocks (PhS-GBs), each including a three-step shape having a long vertical side, a short vertical side, a bottom side with a three-step bottom profile and a flat top side, wherein each of the three steps have a common first width $w_1$, which is about one fourth of a pitch width of a pattern for the mask, wherein each of the three steps has a common first height $h_1$, which is selected to introduce a 90 degree phase shift of light reflected between two adjacent steps during exposure in a lithographic system.

18. The mask of claim 17, wherein the reflective PhSGB includes materials from the group consisting of molybdenum (Mo), aluminum (Al) and actinium (Ac).

19. The mask of claim 17, wherein a plurality of three-step reflective PhSGBs are arranged in a such way:
   the long vertical side of a first reflective PhSGB locates back-to-back with the long vertical side of a second reflective PhSGB;
   the short vertical side of the first reflective PhSGB is separated by the first width $w_1$ from the short vertical side of a third reflective PhSGB.

20. A mask for providing a pattern for an extreme ultraviolet lithography (EUVL), comprising:
   a low thermal expansion material (LTEM) layer;
   a reflective multilayer (ML) above one surface of the LTEM layer;
   a conductive layer above an opposite surface of the LTEM layer;
   a capping layer deposited over the ML; and
   a plurality of reflective phase-shift-gating-blocks (PhS-GBs), each including a triangular-shape profile having a width $w_2$, which is about two times of a minimum pitch width of the pattern and a height $h_2$, which introduces a 360 degree phase shift of a light used in the EUVL.

* * * * *